(12) United States Patent
Yoshizawa et al.

(10) Patent No.: US 10,358,700 B2
(45) Date of Patent: Jul. 23, 2019

(54) THERMAL BARRIER-COATED NI ALLOY COMPONENT AND MANUFACTURING METHOD THEREOF

(71) Applicants: IHI Corporation, Koto-ku (JP); NATIONAL INSTITUTE FOR MATERIALS SCIENCE, Tsukuba-shi (JP)

(72) Inventors: Hiroki Yoshizawa, Tokyo (JP); Akira Tateno, Tokyo (JP); Akihiro Sato, Tokyo (JP); Kota Sasaki, Tokyo (JP); Masato Ishida, Tokyo (JP); Yoshito Yasui, Tokyo (JP); Hideyuki Murakami, Tokyo (JP); Hiromichi Murakami, Tokyo (JP)

(73) Assignees: IHI CORPORATION, Koto-ku (JP); NATIONAL INSTITUTE FOR MATERIALS SCIENCE, Tsukuba-shi (JP)

( * ) Notice: Subject to any disclaimer, the term of this patent is extended or adjusted under 35 U.S.C. 154(b) by 635 days.

(21) Appl. No.: 15/052,243

(22) Filed: Feb. 24, 2016

(65) Prior Publication Data
US 2016/0168661 A1     Jun. 16, 2016

Related U.S. Application Data

(63) Continuation of application No. PCT/JP2014/074189, filed on Sep. 12, 2014.

(30) Foreign Application Priority Data

Sep. 18, 2013  (JP) .................................. 2013-193101

(51) Int. Cl.
*C25D 3/56* (2006.01)
*C25D 3/50* (2006.01)
(Continued)

(52) U.S. Cl.
CPC .......... *C22C 19/057* (2013.01); *B22D 21/005* (2013.01); *C22C 5/04* (2013.01);
(Continued)

(58) Field of Classification Search
CPC .................................. C25D 5/50; C25D 3/567
See application file for complete search history.

(56) References Cited

U.S. PATENT DOCUMENTS

| | | | |
|---|---|---|---|
| 3,677,789 A | 7/1972 | Bungardt et al. | |
| 5,366,695 A | 11/1994 | Erickson | |

(Continued)

FOREIGN PATENT DOCUMENTS

| | | |
|---|---|---|
| JP | 7-138683 | 5/1995 |
| JP | 8-225959 | 9/1996 |

(Continued)

OTHER PUBLICATIONS

International Search Report dated Dec. 2, 2014 in PCT/JP2014/074189 filed Sep. 12, 2014 (with English translation).

(Continued)

*Primary Examiner* — Brian W Cohen
(74) *Attorney, Agent, or Firm* — Oblon, McClelland, Maier & Neustadt, L.L.P.

(57) ABSTRACT

A thermal barrier-coated Ni alloy component includes: a substrate made of a Ni alloy containing Al; an intermediate layer formed on a surface of the substrate; and a thermal barrier layer made of a ceramic and formed on a surface of the intermediate layer. The intermediate layer includes a γ' layer, which is formed from a γ'-Ni₃Al phase on the surface on the thermal barrier layer side, and contains Pt.

12 Claims, 11 Drawing Sheets

(51) Int. Cl.
| | |
|---|---|
| C25D 5/50 | (2006.01) |
| C22C 19/05 | (2006.01) |
| C22C 5/04 | (2006.01) |
| C22F 1/10 | (2006.01) |
| C25D 7/00 | (2006.01) |
| C25D 5/12 | (2006.01) |
| F01D 5/28 | (2006.01) |
| C23C 28/00 | (2006.01) |
| B22D 21/00 | (2006.01) |
| C23C 14/14 | (2006.01) |
| C23C 14/22 | (2006.01) |
| C25D 3/52 | (2006.01) |
| C23C 10/28 | (2006.01) |
| C22F 1/14 | (2006.01) |

(52) U.S. Cl.
CPC ............... *C22F 1/10* (2013.01); *C23C 10/28* (2013.01); *C23C 14/14* (2013.01); *C23C 14/22* (2013.01); *C23C 28/321* (2013.01); *C23C 28/345* (2013.01); *C23C 28/3455* (2013.01); *C25D 3/52* (2013.01); *C25D 3/567* (2013.01); *C25D 5/12* (2013.01); *C25D 5/50* (2013.01); *C25D 7/008* (2013.01); *F01D 5/288* (2013.01); *C22F 1/14* (2013.01); *F05D 2230/90* (2013.01); *F05D 2300/175* (2013.01); *F05D 2300/20* (2013.01)

(56) References Cited

U.S. PATENT DOCUMENTS

| | | | |
|---|---|---|---|
| 5,427,866 | A | 6/1995 | Nagaraj et al. |
| 5,540,790 | A | 7/1996 | Erickson |
| 5,645,893 | A | 7/1997 | Rickerby et al. |
| 5,667,663 | A | 9/1997 | Rickerby et al. |
| 5,763,107 | A | 6/1998 | Rickerby et al. |
| 5,981,091 | A | 11/1999 | Rickerby et al. |
| 6,136,451 | A | 10/2000 | Warnes et al. |
| 6,966,956 | B2 | 11/2005 | Koizumi et al. |
| 7,083,827 | B2 | 8/2006 | Schaeffer |
| 7,771,578 | B2 | 8/2010 | Albrecht et al. |
| 9,719,353 | B2 * | 8/2017 | Bolcavage ............ C23C 28/023 |
| 2004/0229075 | A1 | 11/2004 | Gleeson et al. |
| 2005/0153161 | A1 | 7/2005 | Narita et al. |
| 2006/0011271 | A1 | 1/2006 | Kobayashi et al. |
| 2008/0003129 | A1 | 1/2008 | Gleeson et al. |
| 2008/0038582 | A1 | 2/2008 | Gleeson et al. |
| 2008/0057337 | A1 | 3/2008 | Gleeson et al. |
| 2008/0057338 | A1 | 3/2008 | Gleeson et al. |
| 2008/0057340 | A1 | 3/2008 | Gleeson et al. |
| 2011/0229735 | A1 | 9/2011 | Gleeson et al. |
| 2011/0229736 | A1 | 9/2011 | Gleeson et al. |
| 2011/0318604 | A1 | 12/2011 | Gleeson et al. |
| 2013/0095346 | A1 | 4/2013 | Wu et al. |
| 2013/0230739 | A1 | 9/2013 | Burns et al. |

FOREIGN PATENT DOCUMENTS

| | | |
|---|---|---|
| JP | 2003-253472 A | 9/2003 |
| JP | 2007-503530 | 2/2007 |
| JP | 2007-262431 | 10/2007 |
| JP | 2008-156744 | 7/2008 |
| JP | 2013-112847 | 6/2013 |
| WO | WO 2008/111585 A1 | 9/2008 |

OTHER PUBLICATIONS

Written Opinion dated Dec. 2, 2014 in PCT/JP2014/074189 filed Sep. 12, 2014.

Combined Chinese Office Action and Search Report dated Mar. 31, 2017 in Patent Application No. 201480049558.7 (with English Translation of Category of Cited Documents).

Extended European Search Report dated May 4, 2017 in European Patent Application No. 14846550.3.

Yoshito Yasui, et al., "Oxidation Resistance of Electroplated Pt-Ir Alloy Coatings on Ni-Based Single Crystal Superalloys Followed by Diffusion Annealing Treatment" Japan Institute of Metals, vol. 73, No. 12, 2009, pp. 913-918 (with English abstract).

B. A. Pint, et al., "The Performance of Pt-Modified Alumina-Forming Coatings and Model Alloys" Superalloys, doi:10.7449/2008/Superalloys_2008_641_650, Jan. 1, 2008, pp. 641-650.

Office Action dated Sep. 12, 2017 in Japanese Patent Application No. 2013-193101.

* cited by examiner

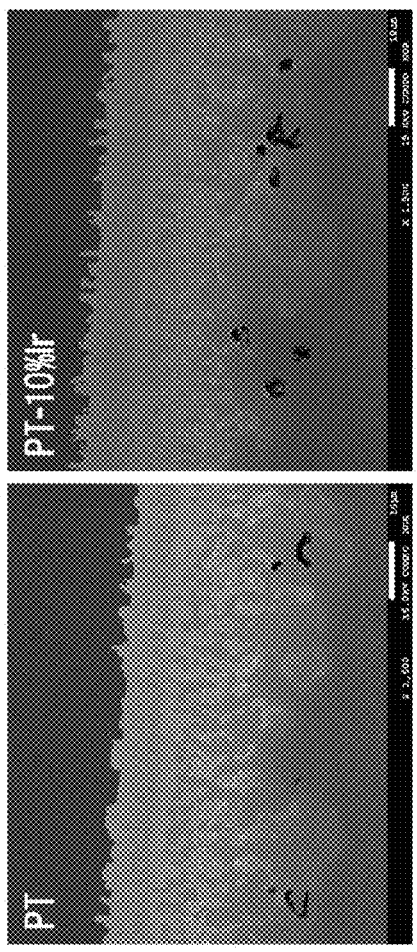
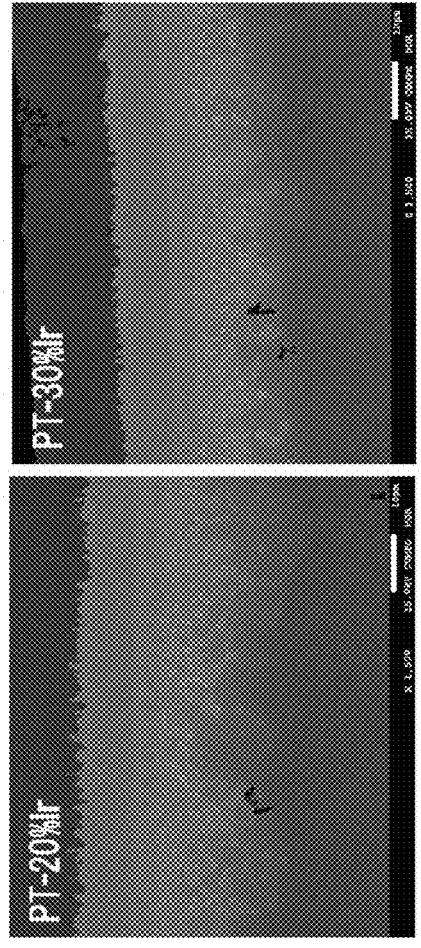
FIG. 4A  FIG. 4B  FIG. 4C  FIG. 4D

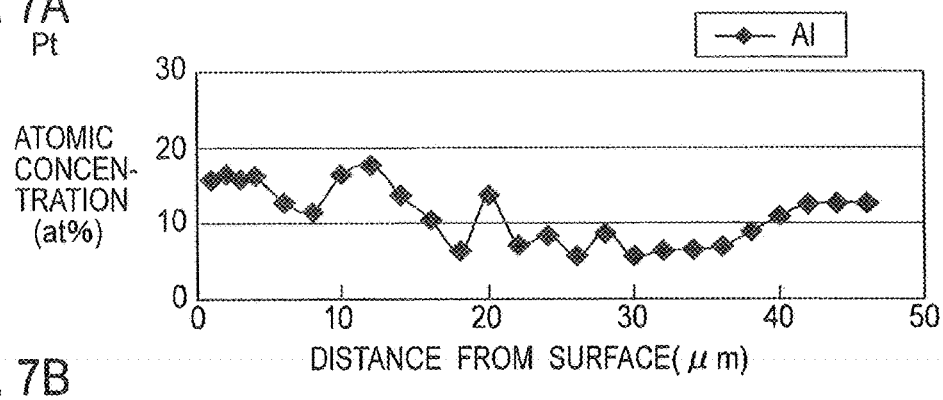
FIG. 7A Pt
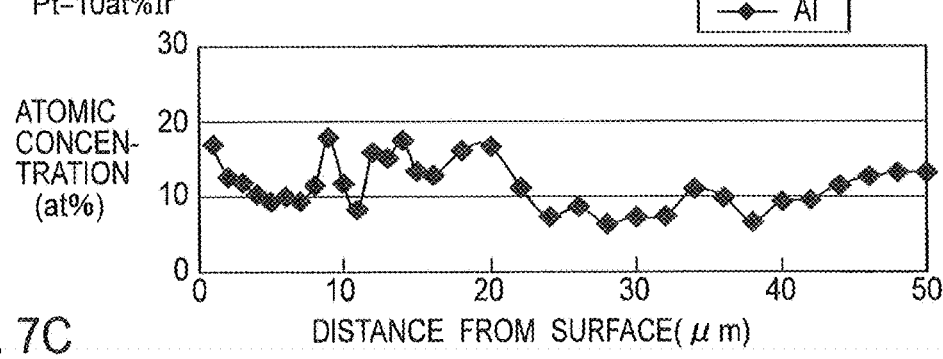
FIG. 7B Pt-10at%Ir
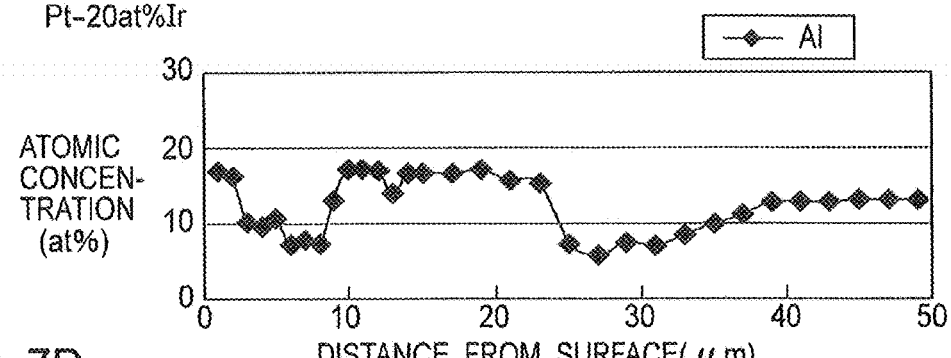
FIG. 7C Pt-20at%Ir
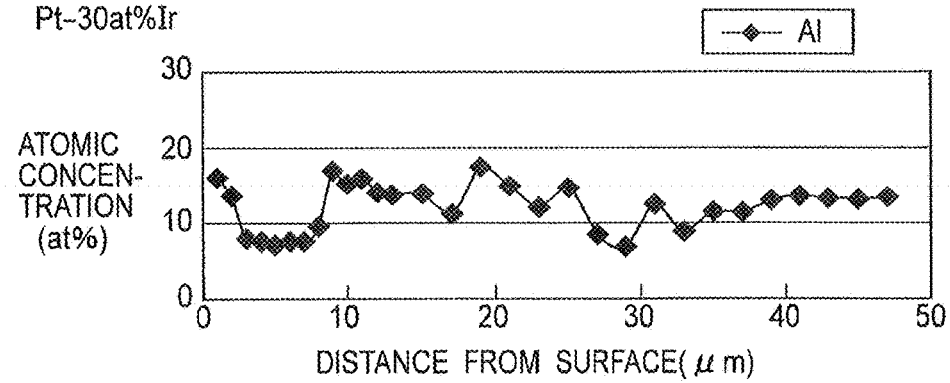
FIG. 7D Pt-30at%Ir

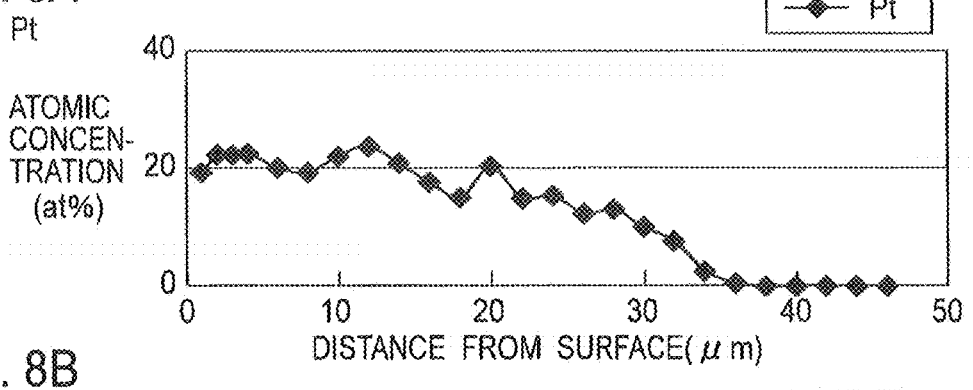
FIG. 8A Pt
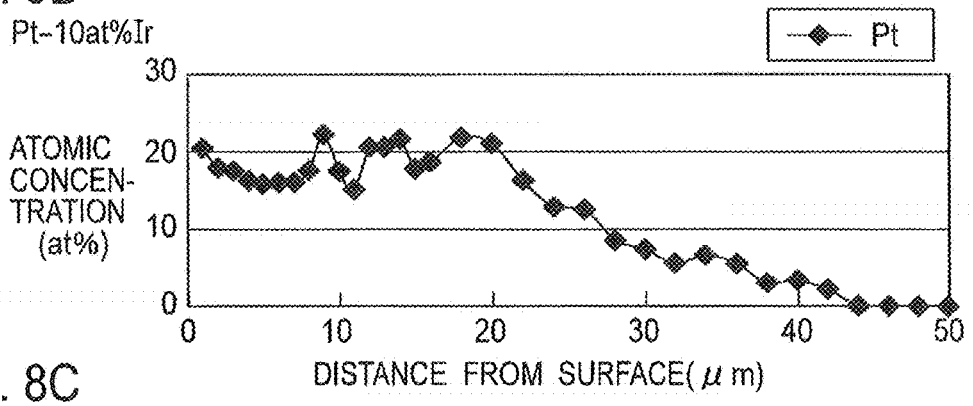
FIG. 8B Pt-10at%Ir
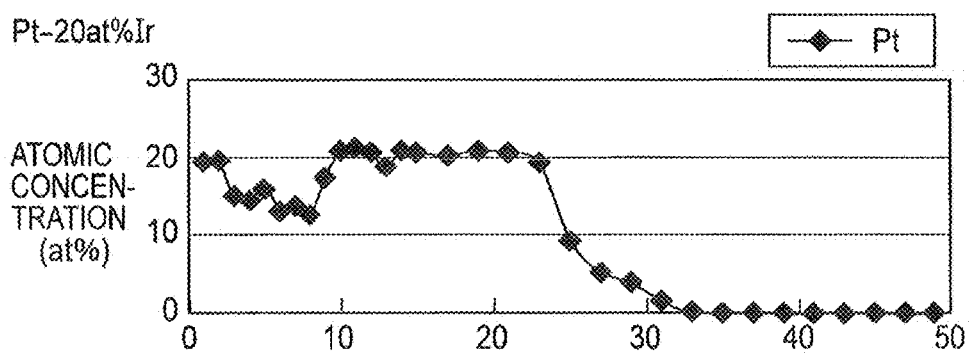
FIG. 8C Pt-20at%Ir
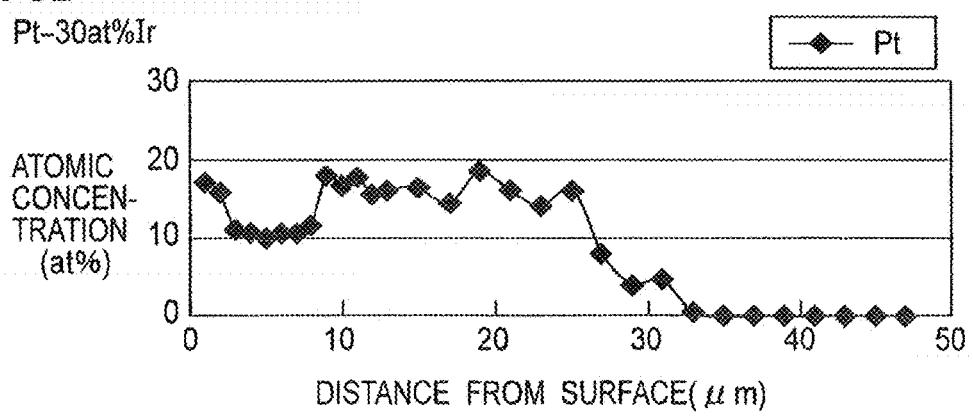
FIG. 8D Pt-30at%Ir Pt Pt-20at%Ir

THERMAL BARRIER-COATED NI ALLOY COMPONENT AND MANUFACTURING METHOD THEREOF

CROSS REFERENCE TO RELATED APPLICATIONS

This application is a continuation application of International Application No. PCT/JP2014/074189, filed on Sep. 12, 2014, which claims priority to Japanese Patent Application No. 2013-193101, filed on Sep. 18, 2013, the entire contents of which are incorporated by references herein.

BACKGROUND

1. Field

The present disclosure relates to a thermal barrier-coated Ni alloy component and a manufacturing method thereof, or more specifically, to a thermal barrier-coated Ni alloy component used for turbine blades and the like in an aircraft jet engine, and an industrial gas turbine, and to a manufacturing method thereof.

2. Description of the Related Art

Ni alloys such as Ni-based single crystal alloys having excellent heat resistance are used for turbine blades and the like in an aircraft jet engine and an industrial gas turbine. A turbine inlet temperature may be raised as a method effective for enhancing thermal efficiency of an air craft jet engine and the like. To raise the turbine inlet temperature, it is effective to apply thermal barrier coating to the turbine blades and the like.

The thermal barrier coating of a Ni alloy such as a Ni-based single crystal alloy generally includes a top coat as a thermal barrier layer located on the outermost layer (on a combustion gas side) and a bond coat as an intermediate layer located inside the top coat (on a substrate side). The top coat is ceramic coating aimed at a thermal barrier effect. The bond coat is metallic coating aimed at enhancement in oxidation resistance of the substrate.

Japanese Patent Application Publication No. 2008-156744 (Patent Literature 1) describes a technique of coating a bond coat of a platinum group metal containing aluminum on a substrate made of a Ni alloy, and coating a top coat made of stabilized zirconia on the platinum group metal bond coat.

SUMMARY

Meanwhile, as the bond coat of the thermal barrier coating, there are: aluminum diffusion coating (aluminizing) formed by use of gas phase diffusion employing a chloride such as aluminum chloride or a fluoride such as aluminum fluoride; and Pt—Al coating in which a Pt-containing film is formed by providing and diffusing Pt (platinum) prior to the aluminum diffusion coating. When the aluminum diffusion coating or the Pt—Al coating is applied to the substrate made of the Ni alloy, the bond coat is formed from a film mainly composed of a β-NiAl phase (a B2-type crystal structure having body-centered cubic lattice as its fundamental form), which is an intermetallic compound of Ni (nickel) and Al (aluminum).

However, the β-NiAl is a brittle phase due to a high ratio of Al therein, and is therefore prone to occurrence of cracks due to thermal cyclic loading and to shortening of a delamination life of the thermal barrier coating attributed to delamination of the top coat.

Accordingly, it is an object of the present disclosure to provide a thermal barrier-coated Ni alloy component and a manufacturing method thereof, which enhance a delamination life of thermal barrier coating.

A thermal barrier-coated Ni alloy component according to the present disclosure includes: a substrate made of a Ni alloy containing Al; an intermediate layer formed on a surface of the substrate; and a thermal barrier layer made of a ceramic and formed on a surface of the intermediate layer. The intermediate layer includes a γ' layer provided on the surface on a thermal barrier layer side, formed from a γ'-Ni$_3$Al phase, and containing Pt.

In the thermal barrier-coated Ni alloy component according to the present disclosure, the γ' layer which contains Ir.

In the thermal barrier-coated Ni alloy component according to the present disclosure, a surface on the thermal barrier layer side of the γ' layer is formed into an indented shape at a pitch greater than 0 μm and equal to or below 5 μm.

In the thermal barrier-coated Ni alloy component according to the present disclosure, the intermediate layer includes a γ containing layer provided on the substrate side of the γ' layer, the γ containing layer made of any one of a γ+γ' layer which is formed from a γ-Ni solid solution phase and the γ'-Ni$_3$Al phase and contains Pt and Ir, and a γ layer which is formed from the γ-Ni solid solution phase and contains Pt and Ir.

In the thermal barrier-coated Ni alloy component according to the present disclosure, a ratio of the γ-Ni solid solution phase in the γ containing layer is greater than 50% and equal to or below 100%.

In the thermal barrier-coated Ni alloy component according to the present disclosure, the intermediate layer includes a diffusion layer provided on the substrate side of the γ containing layer, the diffusion layer being formed by diffusing Pt and Ir into the substrate, and the diffusion layer includes an Ir-concentrated portion formed by concentrating Ir.

In the thermal barrier-coated Ni alloy component according to the present disclosure, the Ni alloy contains Re and Ru.

A method of manufacturing a thermal barrier-coated Ni alloy component according to the present disclosure includes: a substrate forming step of forming a substrate from a Ni alloy containing Al; an intermediate layer forming step of forming an intermediate layer by depositing a metallic film containing Pt on a surface of the substrate, followed by a thermal treatment, the intermediate layer including a γ' layer which is provided on a surface side of the intermediate layer, is formed from a γ'-Ni$_3$Al phase and contains Pt; and a thermal barrier layer forming step of forming a thermal barrier layer on the surface of the intermediate layer by using a ceramic.

In the method of manufacturing a thermal barrier-coated Ni alloy component according to the present disclosure, in the intermediate layer forming step, the metallic film is a Pt—Ir alloy film, and the γ' layer contains Ir.

In the method of manufacturing a thermal barrier-coated Ni alloy component according to the present disclosure, in the intermediate layer forming step, a ratio of Ir in the Pt—Ir alloy film is greater than 0 at % and equal to or below 30 at %.

In the method of manufacturing a thermal barrier-coated Ni alloy component according to the present disclosure, the ratio of Ir in the Pt—Ir alloy film is in a range from 10 at % to 30 at % inclusive.

In the method of manufacturing a thermal barrier-coated Ni alloy component according to the present disclosure, the ratio of Ir in the Pt—Ir alloy film is in a range from 10 at % to 20 at % inclusive.

In the method of manufacturing a thermal barrier-coated Ni alloy component according to the present disclosure, in the intermediate layer forming step, a thermal treatment temperature is in a range from 900° C. to 1200° C., and a thermal treatment time period is in a range from 1 hour to 100 hours.

In the method of manufacturing a thermal barrier-coated Ni alloy component according to the present disclosure, in the intermediate layer forming step, the thermal treatment temperature is in a range from 1000° C. to 1100° C., and the thermal treatment time period is in a range from 1 hour to 10 hours.

In the method of manufacturing a thermal barrier-coated Ni alloy component according to the present disclosure, in the substrate forming step, the Ni alloy contains Re and Ru.

In the method of manufacturing a thermal barrier-coated Ni alloy component according to the present disclosure, the Ni alloy is a Ni-based single crystal superalloy which has the following composition in terms of mass ratio, Co: equal to or below 15.0% by mass,
Cr: from 4.1% by mass to 8.0% by mass inclusive,
Mo: from 2.1% by mass to 6.5% by mass inclusive,
W: equal to or below 3.9% by mass,
Ta: from 4.0% by mass to 10.0% by mass inclusive,
Al: from 4.5% by mass to 6.5% by mass inclusive,
Ti: equal to or below 1.0% by mass,
Hf: equal to or below 0.5% by mass,
Nb: equal to or below 3.0% by mass,
Re: from 3.0% by mass to 8.0% by mass inclusive,
Ru: from 0.5% by mass to 6.5% by mass inclusive, and
with the balance including Ni and unavoidable impurities, and P1 (parameter 1)≤700 is satisfied when P1=137×[W (% by mass)]+24×[Cr (% by mass)]+46×[Mo (% by mass)]−18×[Re (% by mass)].

According to any of the above-described configurations, the surface on a thermal barrier layer side of the intermediate layer is formed from a γ'-Ni$_3$Al phase (an Ll$_2$-type crystal structure being an intermetallic compound of Ni and Al and having face-centered cubic lattice as its fundamental form), which is less brittle than a β-NiAl phase, and has ductility. Thus, occurrence of cracks due to thermal cyclic loading and the like is suppressed, and a delamination life of the thermal barrier coating can further be enhanced. In addition, the γ-Ni$_3$Al phase has a lower ratio of Al than that of the β-NiAl phase. This suppresses formation of a secondary reaction zone (SRZ), which is formed due to diffusion of Al to the substrate, and thus suppresses a drop in high-temperature strength property.

BRIEF DESCRIPTION OF DRAWINGS

FIG. 4A shows an SEM photograph depicting a cross section of a test piece on which a Pt film is deposited according to the embodiment of the present disclosure.

FIG. 4B shows an SEM photograph depicting a cross section of a test piece on which a Pt-10 at % Ir alloy film is deposited according to the embodiment of the present disclosure.

FIG. 4C shows an SEM photograph depicting a cross section of a test piece on which a Pt-20 at % Ir alloy film is deposited according to the embodiment of the present disclosure.

FIG. 4D shows an SEM photograph depicting a cross section of a test piece on which a Pt-30 at % Ir alloy film is deposited according to the embodiment of the present disclosure.

FIG. 7A shows a graph depicting a enlarged concentration curve of Al in the graph of FIG. 6A according to the embodiment of the present disclosure.

FIG. 7B shows a graph depicting a enlarged concentration curve of Al in the graph of FIG. 6B according to the embodiment of the present disclosure.

FIG. 7C shows a graph depicting a enlarged concentration curve of Al in the graph of FIG. 6C according to the embodiment of the present disclosure.

FIG. 7D shows a graph depicting a enlarged concentration curve of Al in the graph of FIG. 6D according to the embodiment of the present disclosure.

FIG. 8A shows a graph depicting a enlarged concentration curve of Pt in the graph of FIG. 6A according to the embodiment of the present disclosure.

FIG. 8B shows a graph depicting a enlarged concentration curve of Pt in the graph of FIG. 6B according to the embodiment of the present disclosure.

FIG. 8C shows a graph depicting a enlarged concentration curve of Pt in the graph of FIG. 6C according to the embodiment of the present disclosure.

FIG. 8D shows a graph depicting a enlarged concentration curve of Pt in the graph of FIG. 6D according to the embodiment of the present disclosure.

DESCRIPTION OF EMBODIMENTS

Figure 1:
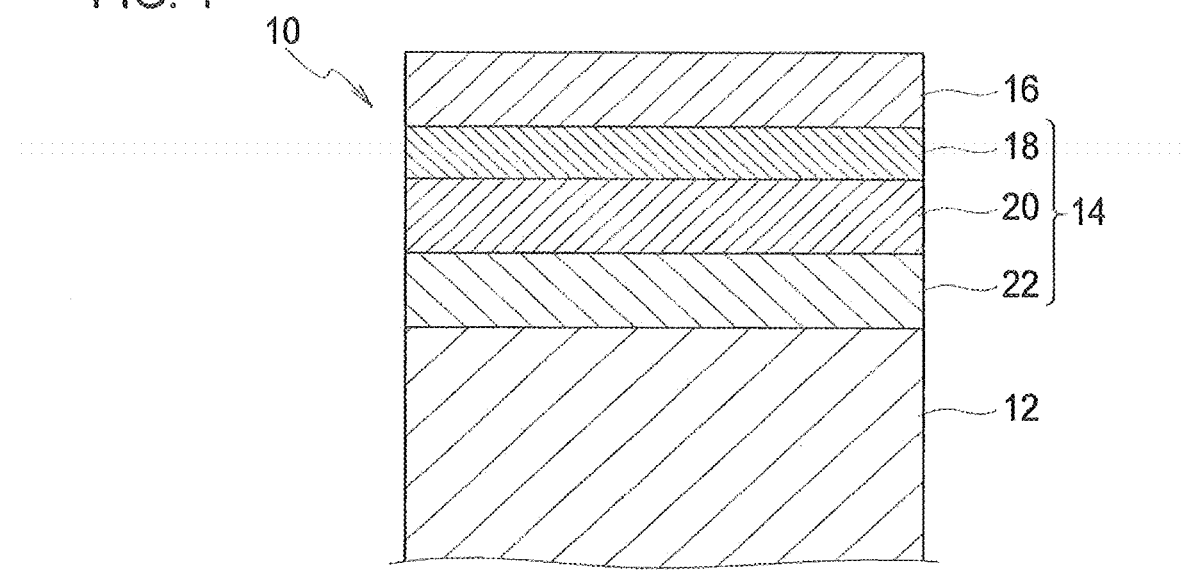
FIG. 1 is a cross-sectional view showing a structure of a thermal barrier-coated Ni alloy component according to an embodiment of the present disclosure.

An embodiment of the present disclosure will be described below in detail by using the drawings. FIG. 1 is a cross-sectional view showing a structure of a thermal barrier-coated Ni alloy component 10. The thermal barrier-coated Ni alloy component 10 includes a substrate 12, an intermediate layer 14, and a thermal barrier layer 16.

A turbine blade, a combustor component or the like of an aircraft jet engine, an industrial gas turbine or the like, for example, is used as the substrate 12. The substrate 12 is made of a Ni alloy containing Al. For example, a Ni-based single crystal alloy, a Ni-based directionally solidified alloy, or the like may be used as the Ni alloy. The Ni-based single crystal alloy is a precipitation-strengthened alloy formed by adding Al to Ni as a base, and dispersing γ'-Ni$_3$Al being a precipitated phase into a γ-Ni solid solution phase being a parent phase. For example, a γ'-Ni$_3$Al phase is dispersed and precipitated in the parent phase at a rate of 60% to 70% (in volume percentage). In general, the Ni-based single crystal alloy is subjected to a solution treatment and then to an aging treatment so as to enhance its strength.

In order to enhance high-temperature creep strength, the Ni-based single crystal alloy may contain Re (rhenium) having a high melting point and Ru (ruthenium) suppressing a topologically close packed (TCP) phase. The above-described Ni-based single crystal alloy includes: TMS-138 (manufactured by NIMS-IHI Corporation, U.S. Pat. No. 6,966,956) containing Ru up to about 3% by mass; and TMS-162 (manufactured by NIMS-IHI Corporation, US Patent Application Publication No. 2006-0011271) containing Ru at or above 4% by mass.

Meanwhile, the Ni-based single crystal alloy may have high relative creep strength (creep strength per specific gravity) under a high temperature. The above-described Ni-based single crystal alloy includes Ni alloys manufactured by IHI Corporation having alloy compositions shown below (International Patent Application Publication No. WO2008-111585):

A Ni-based single crystal superalloy which has the following composition in terms of mass ratio: Co: equal to or below 15.0% by mass, Cr: from 4.1% by mass to 8.0% by mass inclusive, Mo: from 2.1% by mass to 6.5% by mass inclusive, W: equal to or below 3.9% by mass, Ta: from 4.0% by mass to 10.0% by mass inclusive, Al: from 4.5% by mass to 6.5% by mass inclusive, Ti: equal to or below 1.0% by mass, Hf: equal to or below 0.5% by mass, Nb: equal to or below 3.0% by mass, Re: from 3.0% by mass to 8.0% by mass inclusive, Ru: from 0.5% by mass to 6.5% by mass inclusive, and with the balance including Ni and unavoidable impurities, in which P1 (parameter 1)≤700 is satisfied when P1=137×[W (% by mass)]+24×[Cr (% by mass)]+46×[Mo (% by mass)]−18×[Re (% by mass)];

A Ni-based single crystal superalloy which has the following composition in terms of mass ratio: Co: equal to or below 15.0% by mass, Cr: from 5.1% by mass to 8.0% by mass inclusive, Mo: from 2.1% by mass to 6.5% by mass inclusive, W: equal to or below 3.9% by mass, Ta: from 4.0% by mass to 10.0% by mass inclusive, Al: from 4.5% by mass to 6.5% by mass inclusive, Ti: equal to or below 1.0% by mass, Hf: equal to or below 0.5% by mass, Nb: equal to or below 3.0% by mass, Re: from 3.0% by mass to 8.0% by mass inclusive, Ru: from 0.5% by mass to 6.5% by mass inclusive, and with the balance including Ni and unavoidable impurities, in which P1 (parameter 1)≤700 is satisfied when P1=137×[W (% by mass)]+24×[Cr (% by mass)]+46×[Mo (% by mass)]−18×[Re (% by mass)];

A Ni-based single crystal superalloy which has the following composition in terms of mass ratio: Co: from 4.0% by mass to 9.5% by mass inclusive, Cr: from 4.1% by mass to 8.0% by mass inclusive, Mo: from 2.1% by mass to 6.5% by mass inclusive, W: equal to or below 3.9% by mass, Ta: from 4.0% by mass to 10.0% by mass inclusive, Al: from 4.5% by mass to 6.5% by mass inclusive, Ti: equal to or below 1.0% by mass, Hf: equal to or below 0.5% by mass, Nb: equal to or below 3.0% by mass, Re: from 3.0% by mass to 8.0% by mass inclusive, Ru: from 0.5% by mass to 6.5% by mass inclusive, and with the balance including Ni and unavoidable impurities, in which P1 (parameter 1)≤700 is satisfied when P1=137×[W (% by mass)]+24×[Cr (% by mass)]+46×[Mo (% by mass)]−18×[Re (% by mass)];

A Ni-based single crystal superalloy which has the following composition in terms of mass ratio: Co: from 4.0% by mass to 9.5% by mass inclusive, Cr: from 5.1% by mass to 8.0% by mass inclusive, Mo: from 2.1% by mass to 6.5% by mass inclusive, W: equal to or below 3.9% by mass, Ta: from 4.0% by mass to 10.0% by mass inclusive, Al: from 4.5% by mass to 6.5% by mass inclusive, Ti: equal to or below 1.0% by mass, Hf: equal to or below 0.5% by mass, Nb: equal to or below 3.0% by mass, Re: from 3.0% by mass to 8.0% by mass inclusive, Ru: from 0.5% by mass to 6.5% by mass inclusive, and with the balance including Ni and unavoidable impurities, in which P1 (parameter 1)≤700 is satisfied when P1=137×[W (% by mass)]+24×[Cr (% by mass)]+46×[Mo (% by mass)]−18×[Re (% by mass)]; and A Ni-based single crystal superalloy which has the following composition in terms of mass ratio: Co: from 5.0% by mass to 8.0% by mass inclusive, Cr: from 5.1% by mass to 8.0% by mass inclusive, Mo: from 2.2% by mass to 4.8% by mass inclusive, W: equal to or below 1.9% by mass, Ta: from 5.5% by mass to 8.0% by mass inclusive, Al: from 5.4% by mass to 6.0% by mass inclusive, Ti: equal to or below 0.5% by mass, Hf: from 0.08% by mass to 0.5% by mass inclusive, Nb: equal to or below 1.0% by mass, Re: from 4.0% by mass to 7.5% by mass inclusive, Ru: from 1.0% by mass to 5.0% by mass inclusive, and with the balance including Ni and unavoidable impurities.

Here, a reason why the Al content in the above-described Ni-based single crystal superalloy may be set from 4.5% by mass to 6.5% by mass inclusive is that, it is difficult for the superalloy to sufficiently secure high-temperature strength and high-temperature corrosion resistance due to an insufficient amount of precipitation of a γ' phase when Al falls below 4.5% by mass, and it is difficult for the superalloy to undergo a solution treatment and to secure high-temperature strength due to formation of a large amount of an eutectic γ' phase when Al exceeds 6.5% by mass.

The intermediate layer 14 is provided between the substrate 12 and the thermal barrier layer 16, and has a function to enhance adhesion between the substrate 12 and the thermal barrier layer 16 and oxidation resistance of the substrate 12. The intermediate layer 14 has a film thickness in a range from 10 μm to 50 μm, for example.

The intermediate layer 14 includes a γ' layer 18 being formed from the γ'-Ni$_3$Al phase on a surface on a thermal barrier layer 16 side, and containing Pt (platinum). The γ' layer 18 has a film thickness in a range from 2 μm to 5 μm, for example.

An oxide mainly composed of Al$_2$O$_3$ (alumina), which is excellent in oxidation resistance even when oxygen is diffused from the thermal barrier layer 16, is formed by providing the γ' layer 18 formed from the γ'-Ni$_3$Al phase on the surface on the thermal barrier layer 16 side of the intermediate layer 14. Thus, it is possible to enhance the oxidation resistance of the substrate 12.

An oxide containing Ni (such as a Ni oxide and a spinel-type multiple oxide containing Ni and Al), which is poor in the oxidation resistance, is formed in the case of oxidation of the γ-Ni solid solution phase having a lower ratio of Al than that of the γ'-Ni$_3$Al phase. Nevertheless, the oxide mainly composed of Al$_2$O$_3$, which is excellent in the oxidation resistance, is formed by selective oxidation since the γ'-Ni$_3$Al phase has the higher ratio of Al than that of the γ-Ni solid solution phase.

Meanwhile, the γ'-Ni$_3$Al phase is kept from occurrence of cracks even in the case of thermal cyclic loading because the γ'-Ni$_3$Al phase has a lower ratio of Al than that of a β-NiAl phase, and has less brittleness and higher ductility than those of the β-NiAl phase. Moreover, formation of a secondary reaction zone (SRZ) attributed to diffusion of Al to a substrate 12 side is suppressed since the γ'-Ni$_3$Al phase has the lower ratio of Al than that of the β-NiAl phase. As a consequence, a drop in high-temperature strength property (such as high-temperature creep strength) is suppressed even when the Ni alloy contains Re or Ru.

The γ' layer 18 contains Pt. Since Pt has low oxygen permeability, Pt can enhance the oxidation resistance of the substrate 12. In addition, Pt has a function to promote diffusion of Al contained in the Ni alloy to a surface side of the substrate and thus to form the γ' layer 18 that is formed from the γ'-Ni$_3$Al phase.

The γ' layer 18 may contain Pt and Ir (iridium). Ir has low oxygen permeability as with Pt, but is less diffused to the substrate 12 side than Pt is. Accordingly, Ir can further enhance the oxidation resistance of the substrate 12. In addition, Ir has a function to suppress diffusion of Ni from the substrate 12.

By causing the γ' layer 18 to contain Pt and Ir, the surface on the thermal barrier layer 16 side of the γ' layer 18 can be roughened more than when the γ' layer 18 does not contain Ir. By causing the γ' layer 18 to contain Pt and Ir, the surface on the thermal barrier layer 16 side of the γ' layer 18 is formed into an indented shape at a pitch greater than 0 μm and equal to or below 5 μm. The formation of the surface shape on the thermal barrier layer 16 side into the indented shape at the pitch of a short width enhances adhesion between the intermediate layer 14 and the thermal barrier layer 16. In addition, by causing the γ' layer 18 to contain Pt and Ir, the oxidation resistance of the substrate 12 is enhanced because cracks in an oxide film are suppressed more than when the γ' layer 18 does not contain Ir.

The intermediate layer 14 includes a γ containing layer 20, which is located on the substrate 12 side of the γ' layer 18 and contains the γ-Ni solid solution phase. The γ containing layer 20 has a film thickness in a range from 5 μm to 8 μm, for example.

When the γ containing layer 20 contains Pt but does not contain Ir, the γ containing layer 20 is composed of a γ+γ' layer formed from the γ-Ni solid solution phase and the γ'-Ni$_3$Al phase. In this case, a ratio of the γ-Ni solid solution phase contained in the γ containing layer 20 is 50%, for example.

When the γ containing layer 20 contains Pt and Ir, the γ containing layer 20 is composed of either the γ+γ' layer formed from the γ-Ni solid solution phase and the γ'-Ni$_3$Al phase or a γ layer formed from the γ-Ni solid solution phase. In this case, the ratio of the γ-Ni solid solution phase contained in the γ containing layer 20 becomes higher as the content of Ir contained in the γ containing layer 20 is larger. The ratio of the γ-Ni solid solution phase contained in the γ containing layer 20 is greater than 50% and equal to or below 100%, for example. When the content of Ir contained in the γ containing layer 20 is increased and becomes equal to a predetermined ratio, the γ containing layer 20 is formed from the γ layer composed of the single γ-Ni solid solution phase without including any γ'-Ni$_3$Al phase.

The intermediate layer 14 may include a diffusion layer 22, which is located on the substrate 12 side of the γ containing layer 20 and formed by diffusing Pt or a set of Pt and Ir into the substrate 12. Adhesion between the intermediate layer 14 and the substrate 12 can be enhanced by forming the diffusion layer 22. The diffusion layer 22 has a thickness in a range from 10 μm to 30 μm, for example. Meanwhile, the diffusion layer 22 includes an Ir-concentrated portion formed by concentrating Ir. The Ir-concentrated portion is formed to have a higher concentration of Ir than that of the remaining portion of the diffusion layer 22. The Ir-concentrated portion is formed into a layered shape or an island shape, for example. The Ir-concentrated portion has a function as a diffusion barrier that suppresses diffusion of Ni from the substrate 12 to an intermediate layer 14 side.

The thermal barrier layer 16 is made of a ceramic and formed on the surface of the intermediate layer 14. The thermal barrier layer 16 has a function as a thermal barrier layer against heat transfer from a combustion gas and the like. The thermal barrier layer 16 may be made of an oxide by reason of having low oxygen permeability and being excellent in low heat conductivity. The thermal barrier layer 16 is made of zirconia, hafnia, and the like stabilized with yttria. The thermal barrier layer 16 has a thickness in a range from 100 μm to 200 μm, for example.

Figure 2:
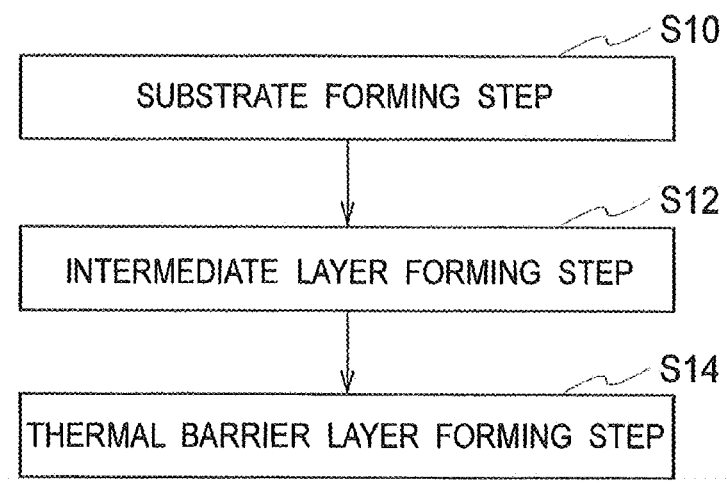
FIG. 2 is a flowchart showing a method of manufacturing a thermal barrier-coated Ni alloy component according to the embodiment of the present disclosure.

Next, a method of manufacturing the thermal barrier-coated Ni alloy component 10 will be described. FIG. 2 is a flowchart showing the method of manufacturing the thermal barrier-coated Ni alloy component 10.

A substrate forming step (S10) is a step of forming the substrate 12 from the Ni alloy containing Al. For example, the substrate 12 is formed by casting in accordance with single crystal casting or directional solidification casting. After molten metal of the Ni alloy is prepared by using a vacuum melting furnace, the molten metal of the Ni alloy containing Al is poured into a mold, and a cast product having a shape of a turbine blade or the like is thus cast.

An intermediate layer forming step (S12) is a step of forming the intermediate layer 14 by coating the surface of the substrate 12 with a metallic film containing Pt and then subjecting the coated substrate 12 to a thermal treatment. Here, the intermediate layer 14 includes the γ' layer 18, which is located on the surface side, is formed from the γ'-Ni₃Al phase, and contains Pt.

A Pt film or a Pt—Ir alloy film is used as the metallic film containing Pt. The Pt film or the Pt—Ir alloy film is coated on the surface of the substrate 12 and then the coated substrate 12 is subjected to the thermal treatment. Thus, Pt and/or Ir being the components of the Pt film or the Pt—Ir alloy film are diffused to the substrate 12 side. At the same time, Ni and Al being the alloy components of the substrate 12 are diffused into the Pt film or the Pt—Ir film. Thus, the intermediate layer 14 including the γ' layer 18, which is located on the surface side, is formed from the γ'-Ni₃Al phase, and contains Pt or the set of Pt and Ir, is formed as a consequence.

Figure 3:
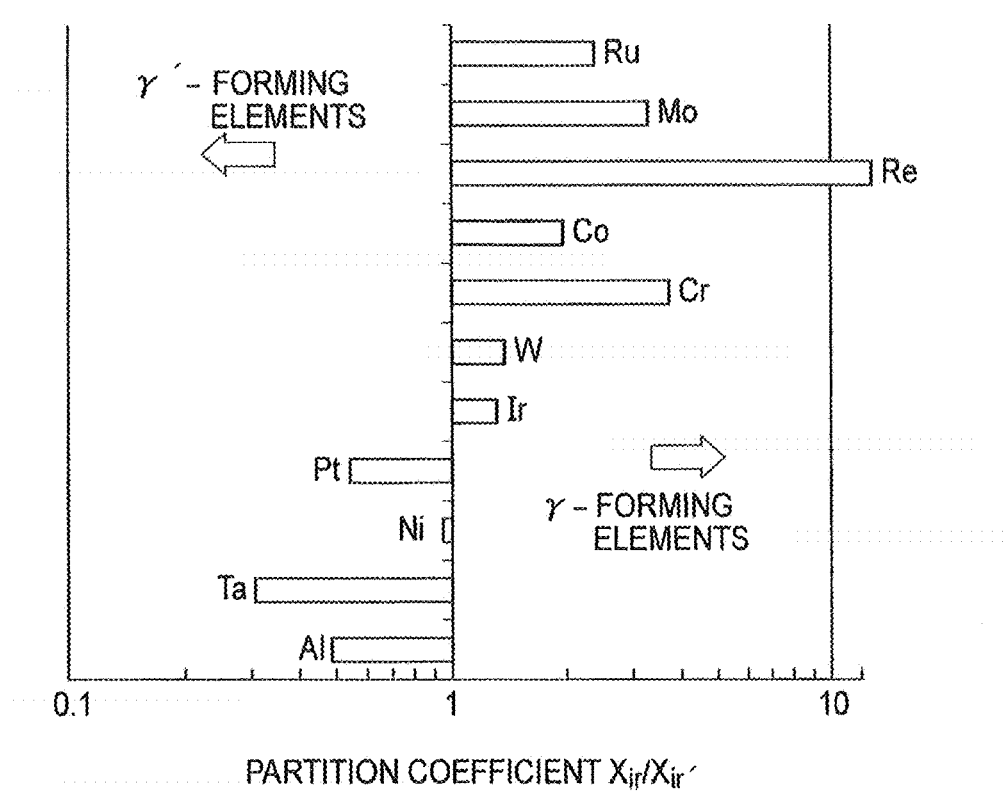
FIG. 3 is a graph showing γ'-Ni$_3$Al phase-forming elements and γ-Ni solid solution phase-forming elements according to the embodiment of the present disclosure.

FIG. 3 is a graph showing γ'-Ni₃Al phase-forming elements and γ-Ni solid solution phase-forming elements. The horizontal axis of the graph in FIG. 3 indicates a partition coefficient $X_{i\gamma}/X_{i\gamma'}$, where $X_{i\gamma}$ represents a concentration of an element i in a γ-Ni solid solution and $X_{i\gamma'}$ represents a concentration of the element i in γ'-Ni₃Al. The graph in FIG. 3 reveals that Pt is a γ'-Ni₃Al phase-forming, element and Ir is a γ-Ni solid solution phase-forming element. Meanwhile, Pt has a function to form an activity gradient by reducing activity of Al, and to promote diffusion of Al to the surface side of the substrate.

A β-NiAl phase having a high ratio of Al is formed in a case of aluminum diffusion coating (aluminizing), for example, where Al is supplied from the outside of the substrate 12 by using aluminum chloride and the like and Al is thus concentrated on the surface of the substrate 12. In this case, however, the γ'-Ni₃Al phase having the lower ratio of Al than that of β-NiAl phase is formed instead of the β-NiAl phase having the high ratio of Al, since Al is concentrated on the surface of the substrate by diffusing Al contained in the Ni alloy to the surface side of the substrate 12. Due to this reason, the γ' layer 18 which is formed from the γ'-Ni₃Al phase, and contains Pt, is formed on the surface on the thermal barrier layer 16 side of the intermediate layer 14.

Moreover, along with the formation of the γ' layer 18, the γ containing layer 20 that contains the γ-Ni solid solution phase is formed on the substrate 12 side of the γ' layer 18. When the Pt film is deposited on the surface of the substrate 12 and then the substrate 12 is subjected to the thermal treatment, the γ containing layer 20 is formed from the γ+γ' layer that is formed from the γ-Ni solid solution phase and the γ'-Ni₃Al phase. When the Pt—Ir alloy film is deposited on the surface of the substrate 12 and then the substrate 12 is subjected to the thermal treatment, the γ containing layer 20 is formed from either the γ+γ' layer that is formed from the γ-Ni solid solution phase and the γ'-Ni₃Al phase, or the γ layer that is formed from the γ-Ni solid solution phase. For example, the γ+γ' layer is formed when the ratio of Ir contained in the Pt—Ir alloy film is 10 at % or 20 at %, or the γ layer is formed when the ratio of Ir contained in the Pt—Ir alloy film is 30 at %. Moreover, the diffusion layer 22 is formed on the substrate 12 side of the γ containing layer 20 by diffusing Pt or the set of Pt and Ir into the substrate 12.

For example, the Pt film or the Pt—Ir alloy film is deposited by electroplating, physical vapor deposition (PVD) including sputtering and ion plating, and the like. General methods are employed in the electroplating and the physical vapor deposition (PVD). In the electroplating, a plating solution containing the Pt element is used in the case of depositing the Pt film or a plating solution containing the Pt element and the Ir element is used in the case of depositing the Pt—Ir alloy film. An alloy composition of the Pt—Ir alloy film can be controlled by changing ratios of a concentration of the Ir-element and a concentration of the Pt-element contained in a plating bath, for example. Incidentally, the plating bath is often acidic in general. Accordingly, when the Pt—Ir alloy film is deposited in accordance with the electroplating, a Pt film may be provided as a foundation coat for preventing the substrate 12 from oxidation. The Pt film or the Pt—Ir alloy film has a thickness in a range from 5 μm to 15 μm, for example. The Pt film as the foundation coat has a thickness in a range from 1 μm to 3 μm, for example.

As the metallic film containing Pt, the Pt—Ir alloy film may be used instead of the Pt film since the surface on the thermal barrier layer 16 side of the γ' layer 18 can be formed into the indented shape at the short width pitch by causing the γ' layer 18 to contain Pt and Ir. Thus, the adhesion between the thermal barrier layer 16 and the intermediate layer 14 can be enhanced. Accordingly, it is possible to roughen the surface into the indented shape even when the surface is located at a position which is hardly exposed in the case of blasting.

A ratio of Ir contained in the Pt—Ir alloy film may be greater than 0 at % and equal to or below 30 at %, because if the ratio of Ir contained in the Pt—Ir alloy film exceeds 30 at %, the Pt—Ir alloy will be brittle and prone to delamination.

The ratio of Ir contained in the Pt—Ir alloy film may be set in a range from 10 at % to 30 at % inclusive, because a delamination life of the thermal barrier coating can further be enhanced by setting the ratio of Ir contained in the Pt—Ir alloy film in the range from 10 at % to 30 at % inclusive.

The ratio of Ir contained in the Pt—Ir alloy film may be set in a range from 10 at % to 20 at % inclusive, because an oxidation resistance property of the intermediate layer 14 can further be enhanced by setting the ratio of Ir contained in the Pt—Ir alloy film equal to or below 20 at %.

The thermal treatment may be performed in vacuum or in an inert atmosphere in order to prevent oxidation. Concerning thermal treatment conditions, a thermal treatment temperature and a thermal treatment time period are adjusted such that the γ' layer 18, which is formed from the γ'-Ni₃Al phase, and contains Pt or the set of Pt and Ir, is formed on the surface side of the intermediate layer 14. As for the thermal treatment conditions, the substrate on which the Pt film or the Pt—Ir film is deposited is subjected to the thermal treatment at the thermal treatment temperature in a range from 900° C. to 1200° C., or equal to or above 1000° C. but below 1100° C., for example. The thermal treatment time period is set in a range from 1 hour to 100 hours, or from 1 hour to 10 hours. A degree of vacuum when the thermal treatment is performed in vacuum is set in a range from $1 \times 10^{-2}$ Pa to $1 \times 10^{0}$ Pa, for example.

Meanwhile, when any of the above-described Ni-based single crystal alloys manufactured by IHI Corporation (International Patent Application Publication No. WO2008-111585) is used as the Ni alloy, an aging temperature of the Ni-based single crystal alloy is 1050° C. and productivity is therefore enhanced by performing the thermal treatment at 1050° C., so that an aging treatment and the thermal treatment can be carried out at the same time.

A thermal barrier layer forming step (S14) is a step of forming the thermal barrier layer 16 on the surface of the intermediate layer 14 by using a ceramic. The thermal barrier layer 16 is formed by the physical vapor deposition (PVD), plasma spraying, and the like. General methods are employed in the physical vapor deposition (PVD) and the plasma spraying. Here, electron beam physical vapor deposition (EB-PVD) may be used as the physical vapor deposition. Regarding the plasma spraying, reduced-pressure plasma spraying may be used in order to prevent oxidation and to form a dense film.

The above-described configuration includes: the substrate made of the Ni alloy containing Al; the intermediate layer formed on the surface of the substrate; and the thermal barrier layer made of the ceramic and formed on the surface of the intermediate layer. Here, the intermediate layer includes the γ' layer, which is formed from the γ'-Ni$_3$Al phase on the surface on a thermal barrier layer side, and contains Pt. Accordingly, the oxide film mainly composed of alumina and excellent in oxidation resistance is formed, and the occurrence of cracks is suppressed as compared to the case of the β-NiAl phase. Thus, the delamination life of the thermal barrier coating is enhanced.

According to the above-described configuration, the γ'-Ni$_3$Al phase has the lower ratio of Al than that of the β-NiAl phase. This suppress formation of the secondary reaction zone (SRZ) attributed to the diffusion of Al. As a consequence, a drop in high-temperature strength property is suppressed even in the case of using a Ni alloy containing Re and Ru which are likely to form the secondary reaction zone (SRZ).

According to the above-described configuration, by causing the γ' layer to contain Pt and Ir, the surface on the thermal barrier layer side of the γ' layer can be roughened in the indented shape at the short width pitch more than when the γ' layer contains Pt only. Thus, the adhesion between the thermal barrier layer and the intermediate layer is enhanced. In addition, by causing the γ' layer to contain Pt and Ir, growth of the oxide film is suppressed and cracks in the oxide film are suppressed more than when the γ' layer contains Pt only. As a consequence, the delamination life of the thermal barrier coating is further enhanced.

Examples

Evaluation of Intermediate Layer Structures

Intermediate layer structures were evaluated. A Ni-based single crystal alloy which has the following composition in terms of mass ratio, namely, Co: 5.5% by mass, Cr: 5.4% by mass, Mo: 2.2% by mass, W: 2.9% by mass, Al: 5.6% by mass, Nb: 0.5% by mass, Ta: 5.5% by mass, Hf: 0.1% by mass, Re: 7.5% by mass, Ru: 5.0% by mass, and with the balance including Ni and unavoidable impurities, was used as a substrate of test pieces. Each test piece was prepared by depositing the Pt film or the Pt—Ir alloy film on the surface of the substrate. Here, three types of the alloy composition of the Pi-Ir alloy film, namely, Pt-10 at % Ir, Pt-200 at % Ir, and Pt-30 at % Ir were employed.

The Pt film and the Pt—Ir alloy films were deposited by magnetron sputtering. Specifically, reverse sputtering was conducted in order to clean the surface of the substrate, and then pre-sputtering was conducted to clean a target. Thereafter, the Pt film or the Pt—Ir alloy film was deposited by setting power output to 800 W and argon pressure to $5 \times 10^{-1}$ Pa. The alloy composition of each Pt—Ir alloy film was controlled by disposing multiple Ir chips on a Pt target. Each of the Pt film and the Pt—Ir alloy films was formed to have a film thickness of about 8 μm.

A thermal treatment was performed after the deposition of each of the Pt film and the Pt—Ir films. Thermal treatment conditions were set in vacuum ($1 \times 10^{-2}$ Pa to $1 \times 10^{-1}$ Pa), at 1050° C., and for 1 hour to 10 hours. After the thermal treatment, each of the test pieces was subjected to SEM observation using a scanning electron microscope (SEM), and to an EPMA (electron probe micro analyzer) analysis.

FIGS. 4A, 4B, 4C and 4D show SEM photographs of cross sections of the respective test pieces. FIG. 4A is an SEM photograph of a cross section of the test piece on which the Pt film is deposited. FIG. 4B is an SEM photograph of a cross section of the test piece on which the Pt-10 at % Ir alloy film is deposited. FIG. 4C is an SEM photograph of a cross section of the test piece on which the Pt-20 at % Ir alloy film is deposited. FIG. 40 is an SEM photograph of a cross section of the test piece on which the Pt-30 at % Ir alloy film is deposited.

Figure 5A:
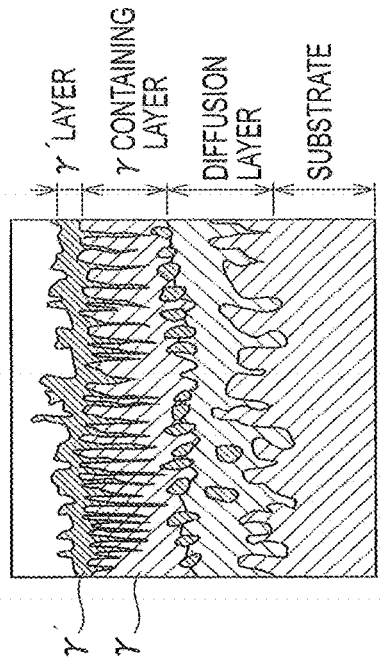
FIG. 5A shows a schematic diagram depicting a sectional structure of the test piece on which the Pt film is deposited according to the embodiment of the present disclosure, which corresponds to the SEM photograph of FIG. 4A.
Figure 5B:
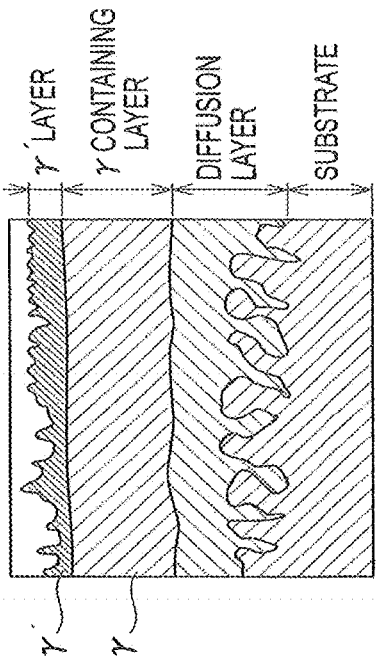
FIG. 5B shows a schematic diagram depicting a sectional structure of the test piece on which the Pt-10 at % Ir alloy film is deposited according to the embodiment of the present disclosure, which corresponds to the SEM photograph of FIG. 4B.
Figure 5C:
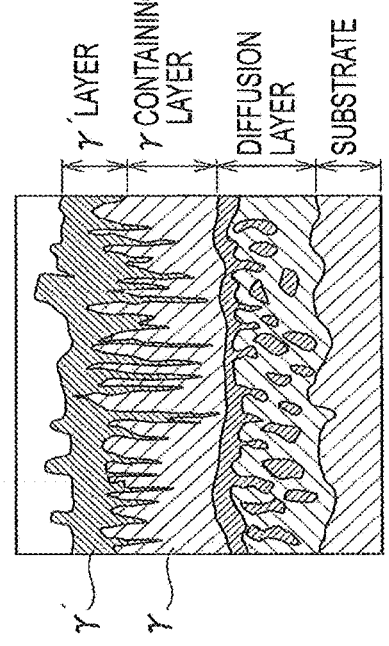
FIG. 5C shows a schematic diagram depicting a sectional structure of the test piece on which the Pt-20 at % Ir alloy film is deposited according to the embodiment of the present disclosure, which corresponds to the SEM photograph of FIG. 4C.
Figure 5D:
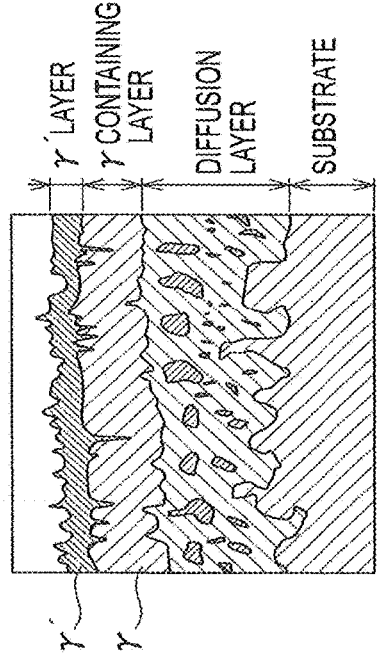
FIG. 5D shows a schematic diagram depicting a sectional structure of the test piece on which the Pt-30 at % Ir alloy film is deposited according to the embodiment of the present disclosure, which corresponds to the SEM photograph of FIG. 4D.

FIGS. 5A, 5B, 5C, and 5D show schematic diagrams depicting sectional structures of the respective test pieces corresponding to the SEM photographs in FIG. 4A to FIG. 4D. FIG. 5A is a schematic diagram of the test piece on which the Pt film is deposited. FIG. 5B is a schematic diagram of the test piece on which the Pt-10 at % Ir alloy film is deposited. FIG. 5C is a schematic diagram of the test piece on which the Pt-20 at % Ir alloy film is deposited. FIG. 5D is a schematic diagram of the test piece on which the Pt-30 at % Ir alloy film is deposited.

Figure 6A:
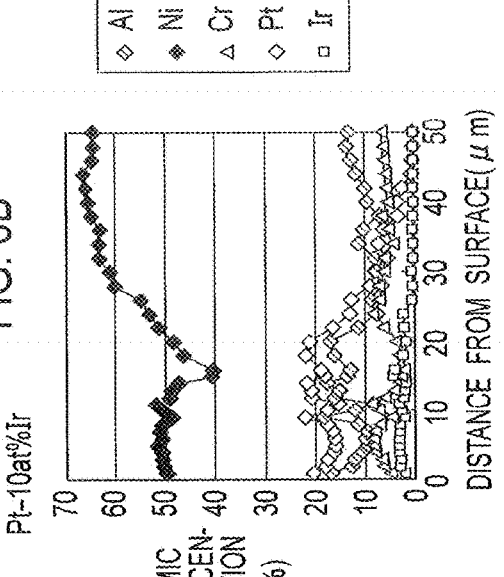
FIG. 6A shows a graph depicting a EPMA line analysis result of the cross section of the test piece on which the Pt film is deposited according to the embodiment of the present disclosure.
Figure 6B:
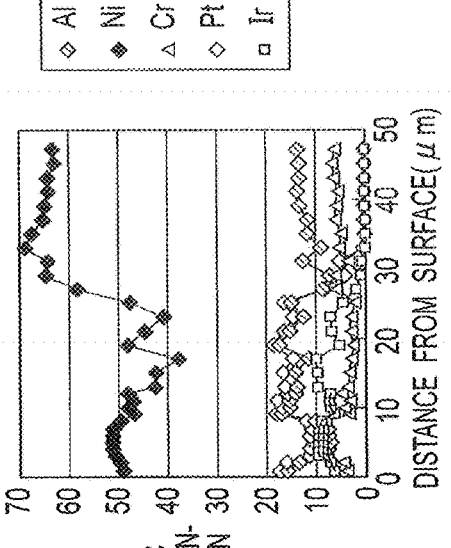
FIG. 6B shows a graph depicting a EPMA line analysis result of the cross section of the test piece on which the Pt-10 at % Ir alloy film is deposited according to the embodiment of the present disclosure.
Figure 6C:
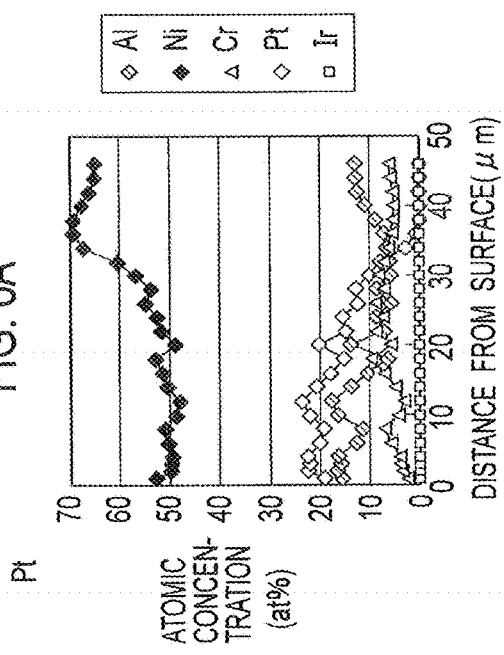
FIG. 6C shows a graph depicting a EPMA line analysis result of the cross section of the test piece on which the Pt-20 at % Ir alloy film is deposited according to the embodiment of the present disclosure.
Figure 6D:
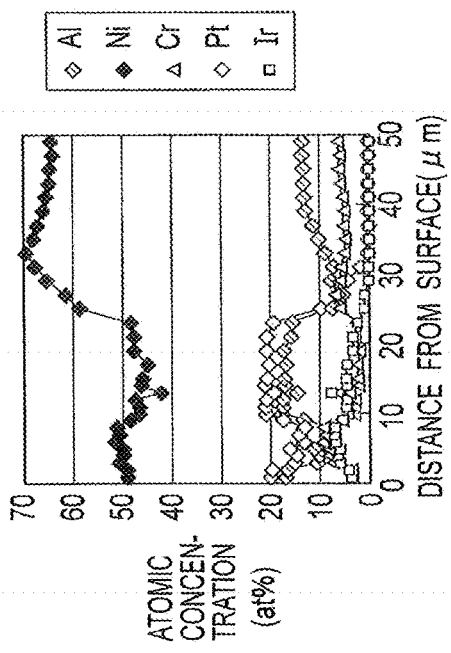
FIG. 6D shows a graph depicting a EPMA line analysis result of the cross section of the test piece on which the Pt-30 at % Ir alloy film is deposited according to the embodiment of the present disclosure.

FIGS. 6A, 6B, 6C, and 6D show graphs depicting EPMA line analysis results of the cross sections of the respective test pieces. FIG. 6A is a graph regarding the test piece on which the Pt film is deposited. FIG. 6B is a graph regarding the test piece on which the Pt-10 at % Ir alloy film is deposited. FIG. 6C is a graph regarding the test piece on which the Pt-20 at % Ir alloy film is deposited. FIG. 6D is a graph regarding the test piece on which the Pt-30 at % Ir alloy film is deposited.

FIGS. 7A, 7B, 7C, and 7D show graphs depicting enlarged concentration curves of Al in the graphs of FIG. 6A to FIG. 6D. FIG. 7A is a graph regarding the test piece on which the Pt film is deposited. FIG. 7B is a graph regarding the test piece on which the Pt-10 at % Ir alloy film is deposited. FIG. 7C is a graph regarding the test piece on which the Pt-20 at % Ir alloy film is deposited. FIG. 7D is a graph regarding the test piece on which the Pt-30 at % Ir alloy film is deposited.

FIGS. 8A, 8B, 8C, and 8D show graphs depicting enlarged concentration curves of Pt in the graphs of FIG. 6A to FIG. 6D. FIG. 8A is a graph regarding the test piece on which the Pt film is deposited. FIG. 8B is a graph regarding the test piece on which the Pt-10 at % Ir alloy film is deposited. FIG. 8C is a graph regarding the test piece on which the Pt-20 at % Ir alloy film is deposited. FIG. 8D is a graph regarding the test piece on which the Pt-30 at % Ir alloy film is deposited.

Figure 9A:
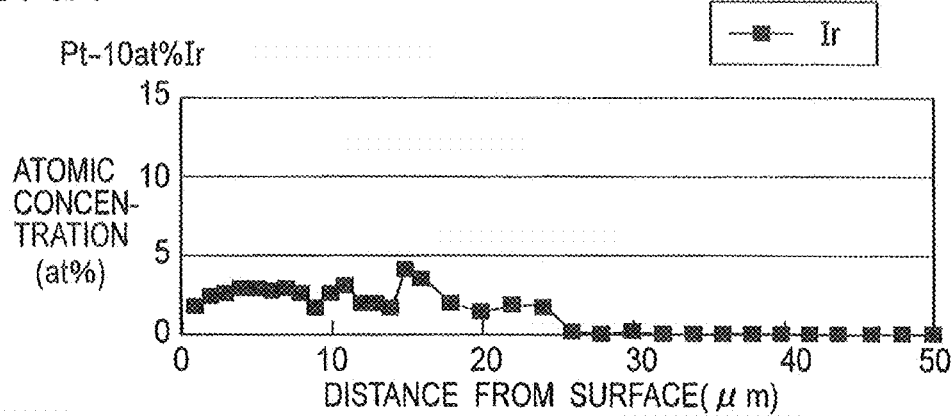
FIG. 9A shows a graph depicting a enlarged concentration curve of Ir in the graph of FIG. 6B according to the embodiment of the present disclosure.
Figure 9B:
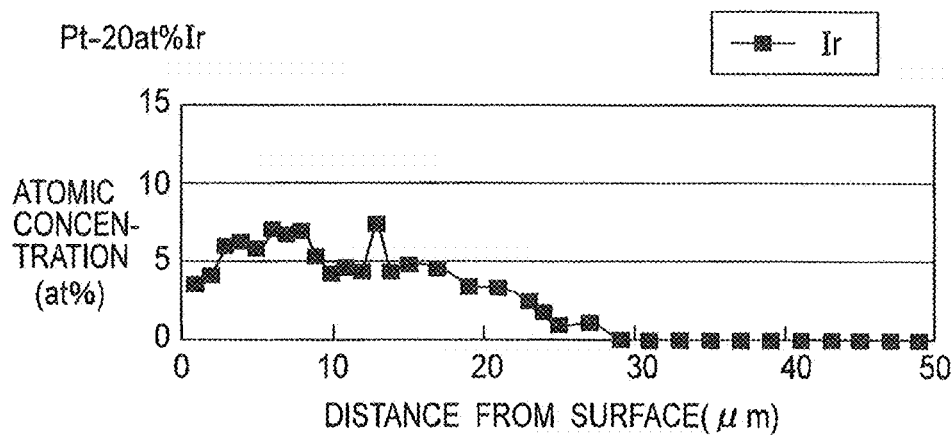
FIG. 9B shows a graph depicting a enlarged concentration curve of Ir in the graph of FIG. 6C according to the embodiment of the present disclosure.
Figure 9C:
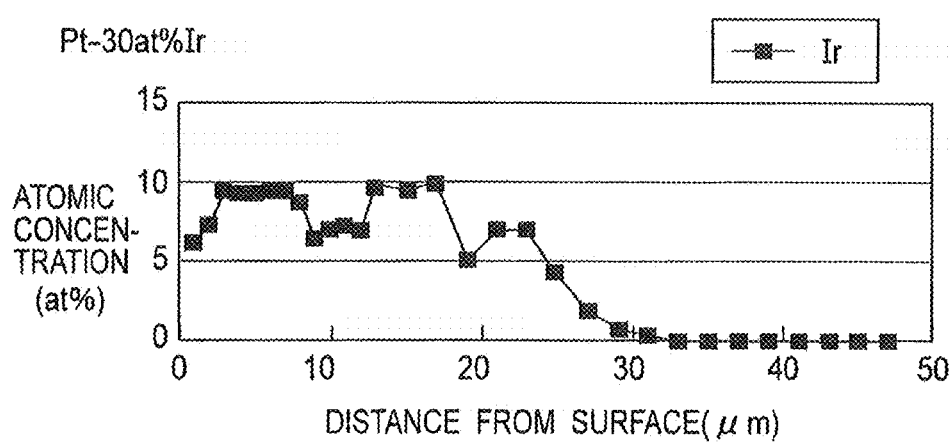
FIG. 9C shows a graph depicting a enlarged concentration curve of Ir in the graph of FIG. 6D according to the embodiment of the present disclosure.

FIGS. 9A, 9B, and 9C show graphs depicting enlarged concentration curves of Ir in the graphs of FIG. 6B to FIG. 6D. FIG. 9A is a graph regarding the test piece on which the Pt-10 at % Ir alloy film is deposited. FIG. 9B is a graph regarding the test piece on which the Pt-20 at % Ir alloy film is deposited. FIG. 9C is a graph regarding the test piece on which the Pt-30 at % Ir alloy film is deposited.

As shown in FIG. 4A to FIG. 9C, the γ' layer formed from the γ'-Ni$_3$Al phase was formed on the outermost layer of every test piece. The γ' layer is formed from a single phase of the γ'-Ni$_3$Al phase without containing any γ-Ni solid solution phase. As apparent from the concentration curves of Al shown in FIG. 7A to FIG. 7D, in every test piece, a concentration of Al (about 20 at %) on the substrate surface side was confirmed to be higher than a concentration of Al inside the substrate, and Al contained in the Ni alloy was confirmed to be diffused from the inside of the substrate to the surface side of the substrate and was concentrated therein. As apparent from the concentration curves of Pt shown in FIG. 8A to FIG. 8D and the concentration curves of Ir shown in FIG. 9A to FIG. 9C, Pt was contained in the γ' layer of the test piece on which the Pt film is deposited, while Pt and Ir were contained in the γ' layer of each of the test pieces on which the Pt—Ir alloy film is deposited. Each γ' layer had a film thickness in a range from 2 μm to 3 μm.

As shown in FIG. 4A to FIG. 5D, regarding the surface shape of the γ' layer, each of the test pieces on which the Pt—Ir alloy film is deposited was provided with indents at a shorter width pitch than those on the test piece on which the Pt film is deposited. The indents were formed at a pitch greater than 0 μm and equal to or below 5 μm on the surface of the γ' layer of each test piece on which the Pt—Ir alloy film is deposited. The indents at a shorter width pitch were formed on the surface of the γ' layer as the content of Ir in the Pt—Ir alloy film was larger. The surface of the γ' layer of the test piece on which the Pt-30 at % Ir alloy film is deposited was provided with the indents at the shortest width pitch.

As shown in FIG. 4A to FIG. 6D, the γ containing layer containing the γ-Ni solid solution layer was formed on a substrate side of the γ' layer of every test piece. The γ+γ' layer formed from the γ-Ni solid solution phase and the γ'-Ni$_3$Al phase was formed as the γ containing layer on each of the test piece on which the Pt film is deposited, the test piece on which the Pt-10 at % Ir alloy film is deposited, and the test piece on which the Pt-20 at % Ir alloy film is deposited. The γ layer formed from the γ-Ni solid solution phase was formed as the γ containing layer on the test piece on which the Pt-30 at % Ir alloy film is deposited. Each γ containing layer had a film thickness in a range from 5 μm to 7 μm.

The ratio of the γ-Ni solid solution phase in the γ containing layer of the test piece on which the Pt film is deposited was equal to 50%. Regarding each of the test pieces on which the Pt—Ir alloy film is formed, the ratio of the γ-Ni solid solution phase in the γ containing layer became higher as the ratio of Ir in the Pt—Ir alloy film was higher. In the test piece on which the Pt-30 at % Ir alloy film is deposited, the γ layer was formed from the single phase of the γ-Ni solid solution phase without containing any γ'-Ni$_3$Al phase. In other words, in each of the test pieces on which the Pt—Ir alloy films are deposited, the ratio of the γ-Ni solid solution phase in the γ containing layer was greater than 50% and equal to or below 100%. Here, the ratio of the γ-Ni solid solution phase in each of the γ containing layers was calculated as an area ratio in the corresponding scanning electron microscope image (SEM image).

As apparent from the concentration curves of Al shown in FIG. 7A to FIG. 7D, in every test piece, the concentration of Al of the γ' layer was higher than that of the γ containing layer. This tendency was more evident in the test pieces on which the Pt—Ir alloy film is deposited. This result also coincided with the fact that the ratio of Al of the γ'-Ni$_3$Al phase was higher than that of the γ-Ni solid solution phase. Meanwhile, the test piece on which the Pt-30 at % Ir alloy film is deposited showed a drop in the concentration of Al in the γ containing layer as compared to the rest of the test pieces. This result also coincided with the fact that the test piece on which the Pt-30 at % Ir alloy film is deposited was formed from the γ layer composed of the γ-Ni solid solution phase without containing any γ'-Ni$_3$Al phase.

As apparent from the concentration curves of Pt shown in FIG. 8A to FIG. 8D, in every test piece, the γ containing layer contained Pt, and the γ' layer has a higher concentration of Pt than the γ containing layer has. This result also coincided with the fact that Pt is the γ'-Ni$_3$Al phase-forming element. As apparent from the concentration curves of Ir shown in FIG. 9A to FIG. 9C, in every test piece on which the Pt—Ir alloy film is deposited, the γ containing layer contained Ir, and the γ containing layer has a higher concentration of Ir than the γ' layer has. This result also coincided with the fact that Ir is the γ-Ni solid solution phase-forming element. Moreover, it was also confirmed that the diffusion of Ir to the substrate side was less than that of Pt based on comparison of the concentration curves of Pt shown in FIG. 8A to FIG. 8D with the concentration curves of Ir shown in FIG. 9A to FIG. 9C.

In every test piece, the diffusion layer was formed on the substrate side of the γ containing layer. As apparent from the concentration curves of Pt shown in FIG. 8A to FIG. 8D, in every test piece, the diffusion layer contained Pt. As apparent from the concentration curves of Ir shown in FIG. 9A to FIG. 9C, in every test piece on which the Pt—Ir alloy film is coated, the diffusion layer contained Ir. Each diffusion layer had a film thickness in a range from 10 μm to 20 μm.

Meanwhile, each test piece with the intermediate layer containing Ir showed an effect that Ir suppressed diffusion of Ni from the substrate. As shown in FIG. 6A to FIG. 6D, the diffusion of Ni from the substrate to an intermediate layer side was reduced when Ir was added to the intermediate layer. For example, in the case of studying a position from a surface in a depth direction where an amount of Ni becomes equal to 60 at %, the position is located away by 30 μm or farther from the surface as shown in FIG. 6A when the intermediate layer does not contain Ir. On the other hand, as shown in FIG. 6B to FIG. 6D, the position is located within a distance of 30 μm when the intermediate layer contains Ir. Thus, it is apparent that the intermediate layer does not expand (the intermediate layer does not become thicker) due to the diffusion of Ni from the substrate and remains stable, by adding Ir to the intermediate layer.

In the meantime, as shown in FIG. 9A to FIG. 9C, an Ir-concentrated portion where Ir is concentrated is formed in the diffusion layer. FIG. 9A shows that the Ir-concentrated portion having the concentration of Ir of about 5 at % is formed at a position at a di stance in the depth direction from the surface equal to about 15 μm. FIG. 9B shows that the Ir-concentrated portion having the concentration of Ir of about 8 at % is formed at a position at a distance in the depth direction from the surface equal to about 13 μm. FIG. 9C shows that the Ir-concentrated portion having the concentration of Ir of about 10 at % is formed at positions at distances in the depth direction from the surface in a range from about 13 μm to 18 μm. As described above, the Ir-concentrated portion formed in the diffusion layer also contributes as a diffusion barrier which suppresses the diffusion of Ni from the substrate to the intermediate layer.

(Evaluation Test of Delamination Life)

A characteristic of a delamination life of each thermal barrier coated-test piece was evaluated. A Ni-based single crystal alloy which is the same as the one used in the evaluation of the intermediate layer structures was used as the substrate of each test piece. Each test piece was formed into a columnar shape having a diameter of 12 mm and a thickness of 5 mm.

Wet polishing by using #120 emery paper was conducted as preprocessing for forming the intermediate layer. Next, the Pt film as a test piece of a first example, the Pt-10 at % Ir alloy film as a test piece of a second example, the Pt-20 at % Ir alloy film as a test piece of a third example, and the Pt-30 at % Ir alloy film as a test piece of a fourth example were deposited in accordance with the electroplating.

After wet polishing, each substrate was subjected to ultrasonic cleaning in ethanol, then to electrolytic degreasing and HCl immersion in order to improve wettability, and then to Ni strike plating. Thereafter, only Pt was deposited in a thickness of 8 μm when the Pt film was deposited on the substrate. Meanwhile, when the Pt—Ir alloy film was deposited, Pt base plating in a thickness of 2 μm was performed for the purpose of enhancing the adhesion, and then the Pt—Ir alloy film was deposited in a thickness of 6 μm.

For the electroplating of the Pt film, $Pt(NH_3)_2(NO_2)_2$ was used for the plating bath, and platinum titanium electrodes were used for electrodes. Meanwhile, the temperature of the plating bath was set to 80° C., and a current density was set to $1.0 \times 10^2$ A·m$^{-2}$.

For the electroplating of the Pt—Ir alloy film, a liquid mixture prepared by mixing $Na_3IrBr_6$, $K_2PtCl_4$, NaBr, NaCl, $C_{10}H_{14}N_2Na_2O_8 \cdot 2H_2O$, and $C_6H_8O_7$ was used for the plating bath, and platinum titanium electrodes were used for electrodes. Meanwhile, the temperature of the plating bath was set to 80° C., and a current density was set to $1.0 \times 10^2$ A·m$^{-2}$. The alloy composition of the Pt—Ir alloy film was controlled by changing ratios of $Na_3IrBr_6$ and $K_2PtCl_4$.

Then, after the Pt film or the Pt—Ir alloy film was deposited on the substrate, the intermediate layer was formed by performing the thermal treatment in vacuum ($1 \times 10^{-2}$ Pa to $1 \times 10^{-1}$ Pa), at 1050° C., and for 1 hour to 10 hours.

A stabilized zirconia ($ZrO_2$–4 mol % $Y_2O_3$) film stabilized by yttria was deposited as the thermal barrier layer on the intermediate layer. The electron beam physical vapor deposition (EB-PVD) was used for the deposition of the stabilized zirconia film. A film thickness of the stabilized zirconia film was set to 180 μm.

Next, thermal cycles were loaded on each thermal barrier coated-test piece. Regarding the thermal cycling loading conditions, a set of holding the test piece in the atmosphere at 1135° C. for 1 hour and then air-cooling the test piece for 1 hour was defined as one cycle, and a point of time when about 25% of the thermal barrier coating was delaminated was defined as a delamination life. Here, the delamination life was calculated as an average of five test pieces of each type.

After the thermal cyclic loading, the delamination lives of the respective test pieces were: 360 cycles in the case of the test piece of the first example; 390 cycles in the case of the test piece of the second example; 510 cycles in the case of the test piece of the third example; and 380 cycles in the case of the test piece of the fourth example. The test results revealed that the test pieces on which the Pt—Ir alloy films are deposited had a longer delamination life than that of the test piece on which the Pt film is deposited. Moreover, regarding the Pt—Ir alloy films, the test pieces on which the Pt—Ir alloy films having the ratio of IR from at least 10 at % to 30 at % inclusive had the longer delamination lives. Among them, the one on which the Pt-20 at % Ir alloy film is deposited had the longest delamination life.

Figure 10:
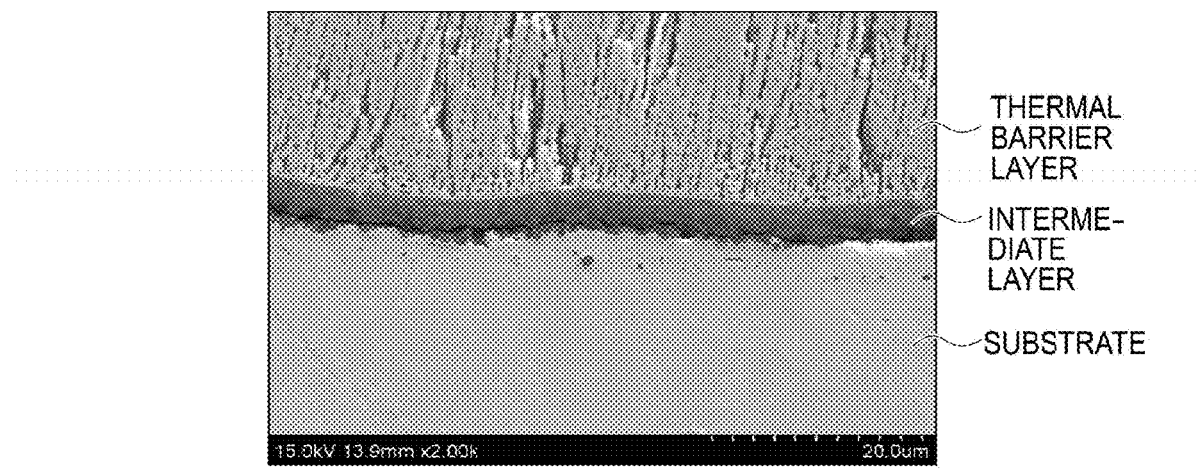
FIG. 10 is an SEM photograph showing a cross section of a test piece of a third example according to the embodiment of the present disclosure.

In the meantime, aside from the above-described delamination evaluation test, the test piece of the third example underwent 100 cycles where each cycle was defined as the set of holding the test piece in the atmosphere at 1135° C. for 1 hour and the air-cooling for 1 hour, and was then subjected to observation of its cross section. FIG. 10 is an SEM photograph of the cross section of the test piece of the third example. The thermal barrier layer, the intermediate layer, and the substrate had good adhesion to one another.

(Oxidation Property Evaluation Test)

Each of the intermediate layers was formed on the surface of the substrate and an oxidation property evaluation test was conducted thereon. The methods of forming the substrate and each intermediate layer were the same as those of the evaluation test of the delamination life. Test pieces not coated with the stabilized zirconia film were used as test pieces for the oxidation property evaluation test.

Regarding test conditions of the oxidation property evaluation test, each test piece underwent 100 cycles where each cycle was defined as the set of holding the test piece in the atmosphere at 1135° C. for 1 hour and the air-cooling for 1 hour. Regarding the oxidation property evaluation, the thickness of the oxide film after 100 cycles was evaluated. Measurement of the thickness of the oxide film was conducted by way of SEM observation.

Figure 11:
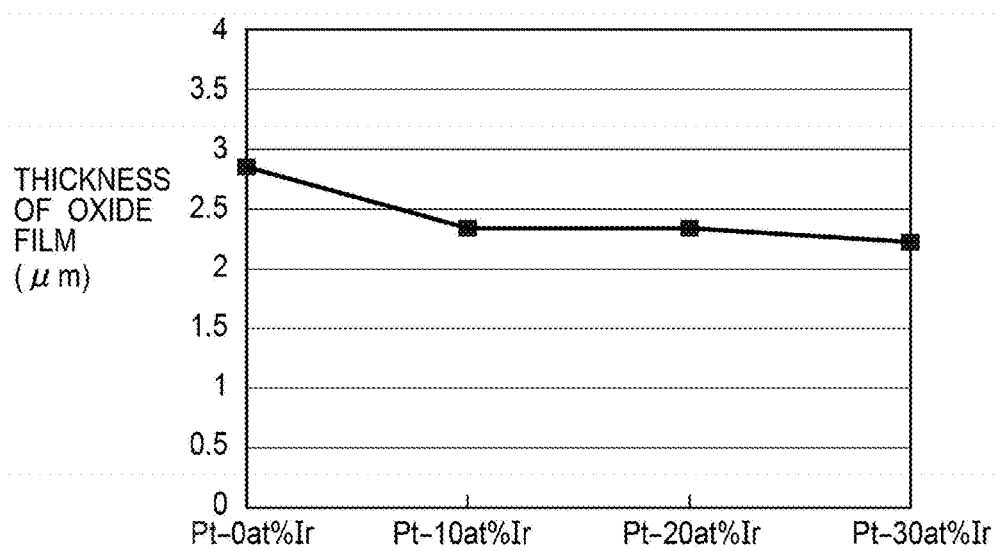
FIG. 11 is a graph showing a result of an oxidation property evaluation test according to the embodiment of the present disclosure.

FIG. 11 is a graph showing a result of the oxidation property evaluation test. In the graph of FIG. 11, black squares indicate the thicknesses of the oxide films of the respective test pieces. The thickness of the oxide film of each test piece on which the Pt—Ir alloy film is deposited was smaller than that of the test piece on which the Pt film is deposited.

Figure 12A:
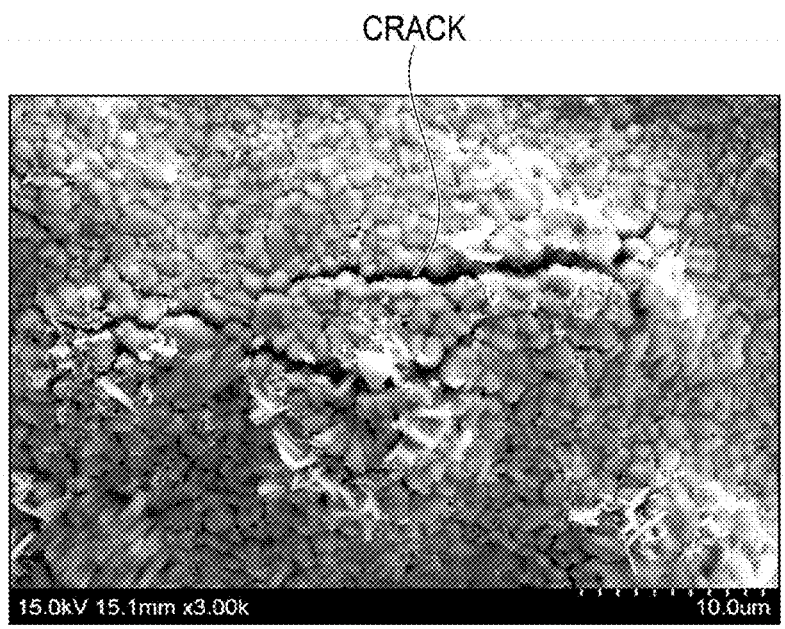
FIG. 12A shows an SEM photograph of an oxide film formed on a surface of the test piece on which the Pt film is deposited after thermal cyclic loading according to the embodiment of the present disclosure.
Figure 12B:
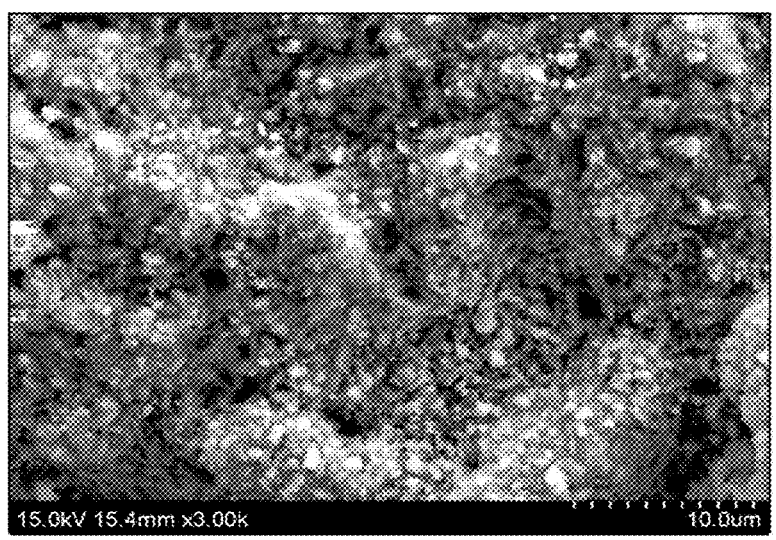
FIG. 12B shows an SEM photograph of an oxide film formed on a surface of the test piece on which the Pt-20 at % Ir film is deposited after thermal cyclic loading according to the embodiment of the present disclosure.

FIG. 12A and FIG. 12B show SEM photographs of the oxide films formed on the surfaces of the test pieces after the thermal cyclic loading, in which FIG. 12A is an SEM photograph of the test piece on which the Pt film is deposited and FIG. 12B is an SEM photograph of the test piece on which the Pt-20 at % Ir film is deposited. While cracks in the oxide film were observed in the test piece on which the Pt film is deposited, no cracks in the oxide film were observed in the test piece on which the Pt-20 at % Ir film is deposited. Meanwhile, in each of the test pieces, the oxide film was formed from an oxide mainly composed of alumina.

Next, the cycle defined as the set of the retention in the atmosphere at 1135° C. for 1 hour and the air-cooling for 1 hour was repeated for 300 cycles. Then, an oxidation weight gain per unit area was measured to evaluate the oxidation property.

Figure 13:
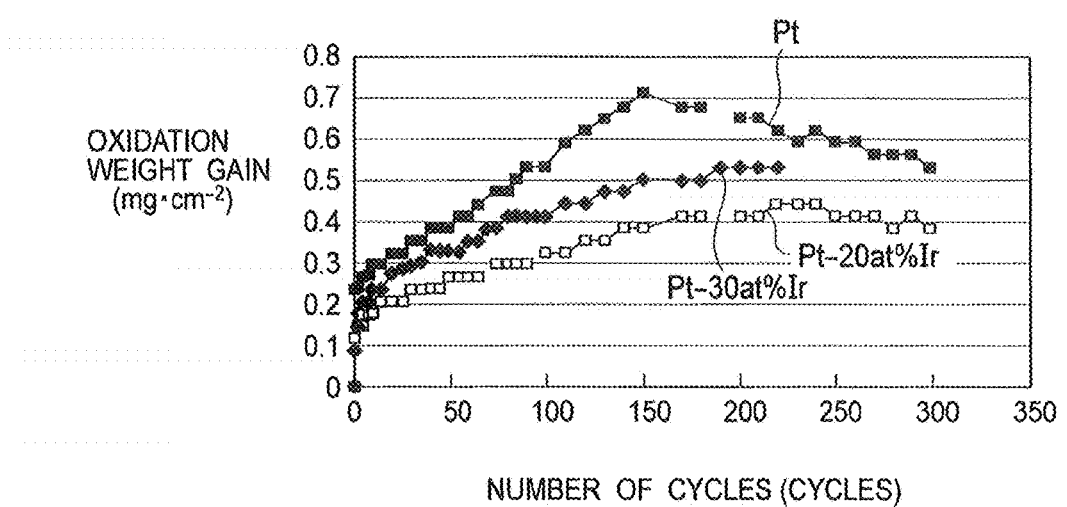
FIG. 13 is a graph showing results of oxidation property evaluation tests according to the embodiment of the present disclosure.

FIG. 13 is a graph showing results of the oxidation property evaluation tests. In the graph of FIG. 13, the horizontal axis indicates the number of cycles and the vertical axis indicates the oxidation weight gain (mg·cm$^{-2}$). The test piece on which the Pt film is deposited was indicated with black squares, the test piece on which the Pt-20 at % Ir alloy film is deposited was indicated with white squares, and the test piece on which the Pt-30 at % Ir alloy film is deposited was indicated with black rhombuses.

The oxidation weight gain of the test piece on which the Pt-20 at % Ir alloy film is deposited and The oxidation weight gain of the test piece on which the Pt-30 at % Ir alloy film is deposited were smaller than that of the test piece on which the Pt film is deposited. Meanwhile, the oxidation weight gain of the test piece on which the Pt-20 at % Ir alloy film is deposited was smaller than that of the test piece on which the Pt-30 at % Ir alloy film is deposited.

These results reveal that the configuration to deposit the Pt—Ir alloy film can suppress growth of the oxide film and occurrence of cracks in the oxide film more efficiently than the configuration to deposit the Pt film. Moreover, the test piece on which the Pt-20 at % Ir alloy film is deposited has the oxidation resistance better than that of the test piece on which the Pt-30 at % Ir alloy film is deposited.

The present disclosure is capable of suppressing occurrence of cracks due to thermal cyclic loading and the like, and thus further enhancing a delamination life of thermal barrier coating. Accordingly, the present disclosure is useful for turbine blades and the like in an aircraft jet engine and an industrial gas turbine.

What is claimed is:

1. A method of manufacturing a thermal barrier-coated Ni alloy component comprising:
    a substrate forming step of forming a substrate from a Ni alloy containing Al;
    an intermediate layer forming step of forming an intermediate layer by depositing a Pt—Ir alloy film on a surface of the substrate, followed by a thermal treatment, the intermediate layer including
        a $\gamma'$ layer which is provided on a surface side of the intermediate layer, is formed from a $\gamma'$-Ni$_3$Al phase and contains Pt and Ir, and
        a $\gamma$ containing layer located on the substrate side of the $\gamma'$ layer, the $\gamma$ containing layer being made of any one of
            a $\gamma+\gamma'$ layer, which is formed from a $\gamma$-Ni solid solution phase and the $\gamma'$-Ni$_3$Al phase and contains Pt and Ir, and
            a $\gamma$ layer, which is formed from the $\gamma$-Ni solid solution phase and contains Pt and Ir,
        the $\gamma'$ layer having a higher concentration of Pt than the $\gamma$ containing layer has, and
        the $\gamma$ containing layer having a higher concentration of Ir than the $\gamma'$ layer has; and
    a thermal barrier layer forming step of forming a thermal barrier layer on the surface of the intermediate layer by using a ceramic.

2. The method of manufacturing a thermal barrier-coated Ni alloy component according to claim 1, wherein
    a surface on the thermal barrier layer side of the $\gamma'$ layer is formed into an indented shape at a pitch greater than 0 µm and equal to or below 5 µm.

3. The method of manufacturing a thermal barrier-coated Ni alloy component according to claim 1, wherein the $\gamma'$ layer is formed from a single phase of the $\gamma'$-Ni$_3$Al phase without containing any $\gamma$-Ni solid solution phase.

4. The method of manufacturing a thermal barrier-coated Ni alloy component according to claim 1, wherein, in the intermediate layer forming step, a ratio of Ir in the Pt—Ir alloy film is greater than 0 at % and equal to or below 30 at %.

5. The method of manufacturing a thermal barrier-coated Ni alloy component according to claim 4, wherein the ratio of Ir in the Pt—Ir alloy film is in a range from 10 at % to 30 at % inclusive.

6. The method of manufacturing a thermal barrier-coated Ni alloy component according to claim 5, wherein, the ratio of Ir in the Pt—Ir alloy film is in a range from 10 at % to 20 at % inclusive.

7. The method of manufacturing a thermal barrier-coated Ni alloy component according to claim 1, wherein, in the intermediate layer forming step, the Pt—Ir alloy film is deposited by electroplating.

8. The method of manufacturing a thermal barrier-coated Ni alloy component according to claim 7, wherein, in the electroplating of the Pt—Ir alloy film in the intermediate layer forming step,
    a liquid mixture prepared by mixing Na$_3$IrBr$_6$, K$_2$PtCl$_4$, NaBr, NaCl, C$_{18}$H$_{14}$N$_2$Na$_2$O$_6$.2H$_2$O, and C$_6$H$_6$O$_7$ is used for a plating bath,
    platinum titanium electrodes are used for electrodes, and
    an alloy composition of the Pt—Ir alloy film is controlled by changing ratios of Na$_3$IrBr$_6$ and K$_2$PtCl$_4$.

9. The method of manufacturing a thermal barrier-coated Ni alloy component according to claim 1, wherein, in the intermediate layer forming step,
    a thermal treatment temperature is in a range from 900° C. to 1200° C., and
    a thermal treatment time period is in a range from 1 hour to 100 hours.

10. The method of manufacturing a thermal barrier-coated Ni alloy component according to claim 9, wherein, in the intermediate layer forming step,
    the thermal treatment temperature is in a range from 1000° C. to 1100° C., and
    the thermal treatment time period is in a range from 1 hour to 10 hours.

11. The method of manufacturing a thermal barrier-coated Ni alloy component according to claim 1, wherein, in the substrate forming step, the Ni alloy contains Re and Ru.

12. The method of manufacturing a thermal barrier-coated Ni alloy component according to claim 11, wherein
    the Ni alloy is a Ni-based single crystal superalloy which has the following composition in terms of mass ratio,
        Co: equal to or below 15.0% by mass,
        Cr: from 4.1% by mass to 8.0% by mass inclusive,
        Mo: from 2.1% by mass to 6.5% by mass inclusive,
        W: equal to or below 3.9% by mass,
        Ta: from 4.0% by mass to 10.0% by mass inclusive,
        Al: from 4.5% by mass to 6.5% by mass inclusive,
        Ti: equal to or below 1.0% by mass,
        Hf: equal to or below 0.5% by mass,
        Nb: equal to or below 3.0% by mass,
        Re: from 3.0% by mass to 8.0% by mass inclusive,
        Ru: from 0.5% by mass to 6.5% by mass inclusive, and
        with the balance including Ni and unavoidable impurities, and
    P1 (parameter 1)≤700 is satisfied when P1=137×[W (% by mass)]+24×[Cr (% by mass)]+46×[Mo (% by mass)]−18×[Re (% by mass)].

* * * * *